(12) United States Patent
Kamei

(10) Patent No.: US 7,951,625 B2
(45) Date of Patent: May 31, 2011

(54) SEMICONDUCTOR LIGHT EMITTING ELEMENT AND METHOD FOR MANUFACTURING SEMICONDUCTOR LIGHT EMITTING DEVICE

(75) Inventor: Hidenori Kamei, Kagoshima (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 12/518,388

(22) PCT Filed: Feb. 19, 2008

(86) PCT No.: PCT/JP2008/000269
§ 371 (c)(1),
(2), (4) Date: Jun. 9, 2009

(87) PCT Pub. No.: WO2008/102548
PCT Pub. Date: Aug. 28, 2008

(65) Prior Publication Data
US 2010/0047939 A1    Feb. 25, 2010

(30) Foreign Application Priority Data
Feb. 21, 2007   (JP) .................... 2007-040236

(51) Int. Cl.
  *H01L 33/52* (2010.01)
  *H01L 33/00* (2010.01)
(52) U.S. Cl. ................... 438/27; 257/E33.056
(58) Field of Classification Search ............ 438/27, 438/33; 257/E33.056
See application file for complete search history.

(56) References Cited

U.S. PATENT DOCUMENTS

| | | | |
|---|---|---|---|
| 6,365,429 B1 * | 4/2002 | Kneissl et al. | 438/46 |
| 7,772,020 B2 * | 8/2010 | Yoo | 438/29 |
| 2006/0057344 A1 * | 3/2006 | Sakurai et al. | 428/212 |
| 2006/0284195 A1 | 12/2006 | Nagai | |
| 2008/0149945 A1 * | 6/2008 | Nagai | 257/88 |

FOREIGN PATENT DOCUMENTS

| | | |
|---|---|---|
| JP | 2001-168383 | 6/2001 |
| JP | 2002-158193 | 5/2002 |
| JP | 2005-252222 | 9/2005 |
| JP | 2006-128659 | 5/2006 |
| JP | 2006-279080 | 10/2006 |

* cited by examiner

*Primary Examiner* — Matthew Smith
*Assistant Examiner* — Christine Enad
(74) *Attorney, Agent, or Firm* — McDermott Will & Emery LLP

(57) ABSTRACT

In a semiconductor light emitting device, light is lost from a side surface of a substrate; therefore, if a substrate side surface occupies a large area, it decreases light extraction efficiency. The area of the substrate side surface may be reduced by reducing a thickness of the substrate. However, a thin substrate has low mechanical strength and is cracked by a stress during work process, and that decreases the yield.
A light emitting layer is formed on a substrate. After fixed to a grinding board with wax, the substrate is ground to thin. A support substrate is then bonded to the substrate for reinforcement. The substrate is fixed to an electrode and others, with the support substrate bonded to the substrate. The support substrate is lastly removed.

6 Claims, 7 Drawing Sheets

SEMICONDUCTOR LIGHT EMITTING ELEMENT AND METHOD FOR MANUFACTURING SEMICONDUCTOR LIGHT EMITTING DEVICE

This application is the U.S. National Phase under 35 U.S.C. §371 of International Application No. PCT/W2008/000269, filed on Feb. 19, 2008, which in turn claims the benefit of Japanese Application No. 2007-040236, filed on Feb. 21, 2007, the disclosures of which Applications are incorporated by reference herein.

TECHNICAL FIELD

The present invention relates to a semiconductor light emitting element in which a light emitting layer is formed on a thin substrate, and a method of fabricating a semiconductor light emitting device.

BACKGROUND ART

Semiconductor light emitting devices, such as light emitting diodes and laser diodes, can be obtained by forming a light emitting layer on a sapphire substrate or a GaN-based substrate. This substrate becomes unnecessary once the light emitting layer is formed. The light emitting layer is stable on the substrate, and therefore, the substrate is not removed but used as a part of the semiconductor light emitting element. As such, a transparent material is used for the substrate.

In semiconductor light emitting elements, a reduction in thickness of the substrate reduces loss of light which leaks from a side surface of the substrate. Thus, a reduction in substrate thickness is a way to be close to surface emitting.

On the other hand, a reduction in substrate thickness reduces the mechanical strength of the substrate, and as a result, the substrate may be cracked and the yield may be decreased. As a solution to this problem, a technique is provided in which a light emitting layer is formed on a substrate, fixed to an electrode, and then detached from the substrate using laser irradiation (see Patent Document 1).

There is also a technique in which a substrate is attached to another substrate using a double-faced tape; air bubbles at the attached portion are removed; and the thickness of the substrate is reduced without causing any cracks in the substrate (see Patent Document 2).

Patent Document 1: Japanese Laid-Open Patent Application Publication No. 2006-128659
Patent Document 2: Japanese Laid-Open Patent Application Publication No. 2002-158193

DISCLOSURE OF INVENTION

Problems to be Solved by the Invention

A light emitting layer is thinly formed on a substrate using a thin film formation method such as MOCVD, and thus, if the substrate is removed using laser irradiation, properties of the light emitting layer may be deteriorated due to thermal or mechanical damage caused by the laser irradiation. Even if the thickness of the substrate can be reduced with stability, forming a light emitting layer on the thin substrate may cause cracks in the substrate during a work process.

Preferably, the light emitting layer is formed on a thick substrate, and the substrate thickness can be reduced with stability. The present invention was made in view of these problems.

Means for Solving the Problems

According to the present invention, to solve the above problems, a light emitting layer is formed on a thick substrate and the substrate is fixed to a grinding board before being ground to reduce the substrate thickness. A support substrate is then temporarily bonded to the thinned substrate. After that, the substrate is detached from the grinding board, with the support substrate temporarily bonded to the substrate, and the substrate is cut into separate elements, which are fixed to a submount provided with a lead-out electrode and others. The support substrate is last removed after completion of a semiconductor light emitting device as in the above.

Effects of the Invention

According to the present invention, a light emitting layer is formed on a thick substrate and the substrate is ground thin. The thinned substrate, whose mechanical strength is now reduced, is reinforced with a support substrate. This means that the substrate is worked after the substrate is thinned and in the circumstances where the mechanical strength of the substrate is maintained. Semiconductor light emitting devices with a thin substrate can thus be obtained in good yield using the same fabrication equipment as conventional fabrication equipment.

DESCRIPTION OF REFERENCE NUMERALS

Figure 1:
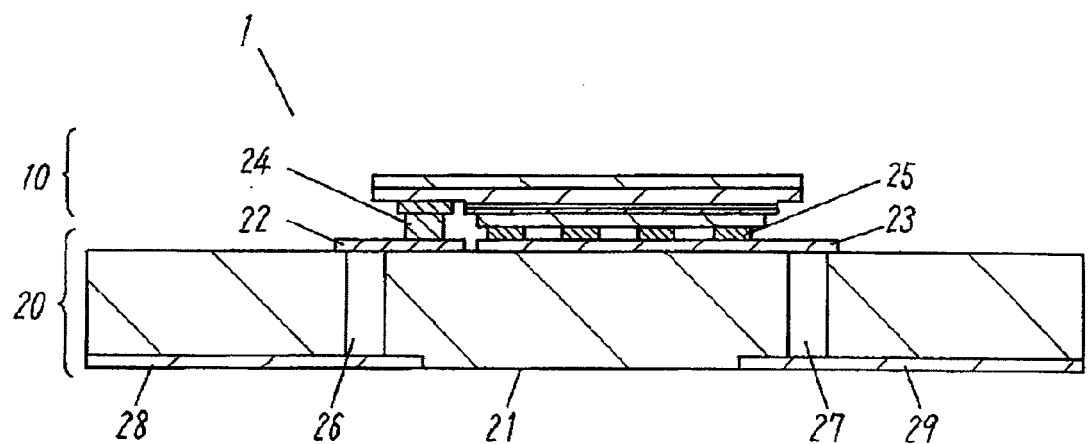
FIG. 1 illustrates a structure of a semiconductor light emitting device.

1 semiconductor light emitting device
10 semiconductor light emitting element
11 substrate
12 n-type layer
13 active layer
14 p-type layer
16 n-side electrode
17 p-side electrode
20 support body
21 submount
22 n-side lead-out electrode
23 p-side lead-out electrode
24 n-side bump
25 p-side bump
26, 27 through holes
30 radiant surface
36 grinding board
38 filling material 42 support substrate
44 notch
50 phosphor-containing sealing layer
57 radiant surface to which a total reflection prevention treatment is given

EXAMPLE EMBODIMENTS

Embodiment 1

A semiconductor light emitting device 1 of the present invention is shown in FIG. 1. The semiconductor light emitting device 1 has a structure in which a semiconductor light emitting element 10 is fixed onto a submount 21.

Lead-out electrodes 22 and 23 are provided on the submount 21. These lead-out electrodes are intended to apply a current to the semiconductor light emitting element 10. The lead-out electrodes include an n-side lead-out electrode 22 connected to an n-type layer side of the semiconductor light emitting element, and a p-side lead-out electrode 23 connected to a p-type layer side of the semiconductor light emitting element. As shown in FIG. 1, the lead-out electrodes are connected to rear electrodes 28 and 29 via through holes 26 and 27, respectively. Due to this structure, a current can flow from the rear electrodes 28 and 29 to the semiconductor light emitting element. The rear electrodes include an n-side rear electrode 28 and a p-side rear electrode 29.

The lead-out electrodes are provided with bumps 24 and 25. Like the lead-out electrodes, the bumps include an n-side bump 24 connected to the n-type layer, and a p-side bump 25 connected to the p-type layer. Although FIG. 1 shows a plurality of p-side bumps, these p-side bumps are collectively referred to as a p-side bump 25. Of course, there may be a plurality of n-side bumps.

The lead-out electrodes and the semiconductor light emitting element are directly connected to each other through the bumps. Hence, the bumps are connecting wires. The submount, lead-out electrodes, rear electrodes, through holes, and bumps are collectively referred to as a support body 20. The rear electrodes, through holes and bumps may be omitted from the support body 20 in other embodiments.

Materials for the submount 21 may include silicon zener diode, silicon diode and silicon, and aluminum nitride, alumina and other ceramics.

The through holes are bored in the submount and filled with a conductive material such as copper, aluminum and gold. The rear electrodes 28 and 29 are electrically connected with the through holes and made of a conductive material such as copper, silver and gold. The lead-out electrodes are made of a conductive material such as copper, aluminum, gold and silver.

The bumps have the function of fixing the semiconductor light emitting element 10 on the submount 21 and electrically connecting the semiconductor light emitting element 10 with the lead-out electrodes 22 and 23.

Materials for the bumps may include gold, gold-tin, solder, indium alloy, and conductive polymer. Gold and a material which includes gold as a main component are in particular preferable. The bumps can be formed by a method such as plating, vacuum evaporation, screen printing, droplet ejection, and a wire bump method, using the above materials.

For example, in the wire bump method, a gold wire is prepared and one end of the gold wire is bonded to a lead-out electrode on the submount, using a bonder. Then the wire is cut, and a gold bump is obtained. It is also possible to use the droplet ejection method according to which a volatile solvent in which nanoparticles of a high conductive material such as gold are dispersed, is printed using a technique similar to ink-jet printing, and the solvent is removed by volatilization to obtain bumps as a collective of nanoparticles.

Figure 2:
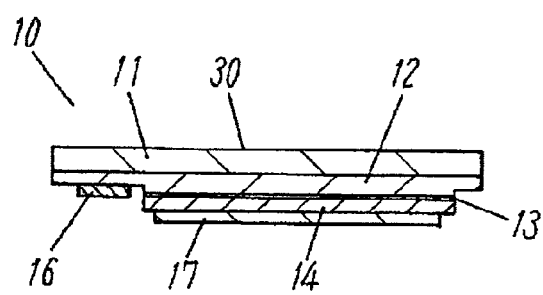
FIG. 2 illustrates a cross-sectional view of a semiconductor light emitting element.
Figure 3:
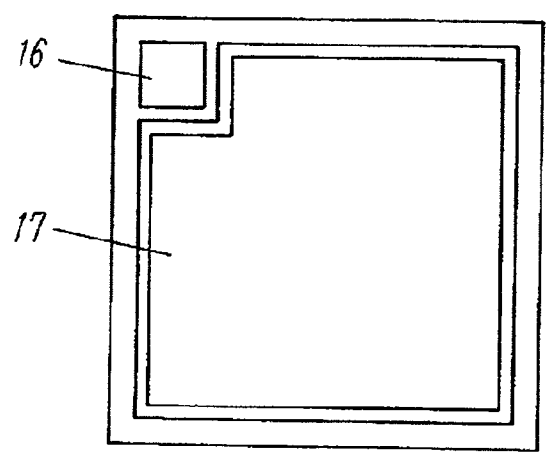
FIG. 3 illustrates a plan view of a semiconductor light emitting element viewed from its radiant surface.

FIG. 2 illustrates a cross-sectional view of the semiconductor light emitting element 10. FIG. 3 illustrates a plan view of the semiconductor light emitting element 10 viewed from above the substrate. The semiconductor light emitting element 10 is composed of a substrate 11, an n-type layer 12, an active layer 13, a p-type layer 14, an n-side electrode 16, and p-side electrode 17.

The substrate 11 has the function of holding a light emitting layer. Sapphire, an insulating material, can be used as a material for the substrate 11. However, considering the luminous efficiency and the fact that the base material for a light emitting portion is gallium nitride (GaN), materials such as GaN, SiC, AlGaN and AlN each having a refractive index equivalent to the refractive index of a material for the light emitting layer are suitable for the substrate to reduce light reflection at the interface between the n-type layer 12 and the substrate 11. According to the fabrication method of the present invention, it is possible to reduce the substrate thickness without causing any cracks in the substrate. Accordingly, the present invention is particularly advantageous in using materials such as GaN, SiC, AlGaN and AlN which tend to be cleaved. According to the fabrication method of the present invention, the thickness of the substrate 11 can be reduced to 50 μm or less.

The n-type layer 12, the active layer 13 and the p-type layer 14 are sequentially stacked on the substrate 11 and function as a light emitting layer. Materials for these layers are not restricted, but gallium nitride based compounds (namely, GaN for the n-type layer 12, InGaN for the active layer 13, and GaN for the p-type layer 14) are preferable. AlGaN and InGaN may be used as the materials for the n-type layer 12 and the p-type layer 14. It is also possible to provide a buffer layer of GaN and InGaN between the n-type layer 12 and the substrate 11. Moreover, the active layer 13 may have, for example, a multilayer structure (quantum well structure) in which InGaN and GaN are alternately stacked.

The active layer 13 and the p-type layer 14 are removed from part of the n-type layer 12, the active layer 13 and the p-type layer 14, which are stacked on the substrate 11 as described in the above, to expose the n-type layer 12. An n-side electrode 16 is formed on the exposed surface of the n-type layer 12. Similarly, an p-side electrode 17 is formed on the p-type layer 14. In other words, the active layer 13 and the p-type layer 14 is removed to expose the n-type layer 12, and this makes it possible to provide the light emitting layer, the p-side electrode and the n-side electrode on the same side of the substrate.

In order to reflect light emitted from the light emitting layer toward the substrate 11, a first electrode made of such as Ag, Al, and Rh whose reflectivity is high is used as the p-side electrode 17. Thus, the upper surface of the substrate 11 is a radiant surface 30. It is more preferable if an electrode layer made of such as Pt, Ni, Co and ITO is provided between the p-type layer 14 and the p-side electrode 17 to reduce ohmic contact resistance between the p-type layer 14 and the p-side electrode 17. Al, Ti and others may be used as the n-side electrode 16. It is preferable that Au and Al are used at surfaces of the p-side electrode 17 and n-side electrode 16 to increase bonding strength between the surfaces and the bumps. These electrodes can be formed by a method such as vacuum evaporation and sputtering.

The size of the semiconductor light emitting element 10 is not specifically limited. However, in order to obtain a light source capable of emitting a large amount of light and close to surface emitting, it is better that the entire area is large, preferably that each side is 600 µm or more.

Figure 4:
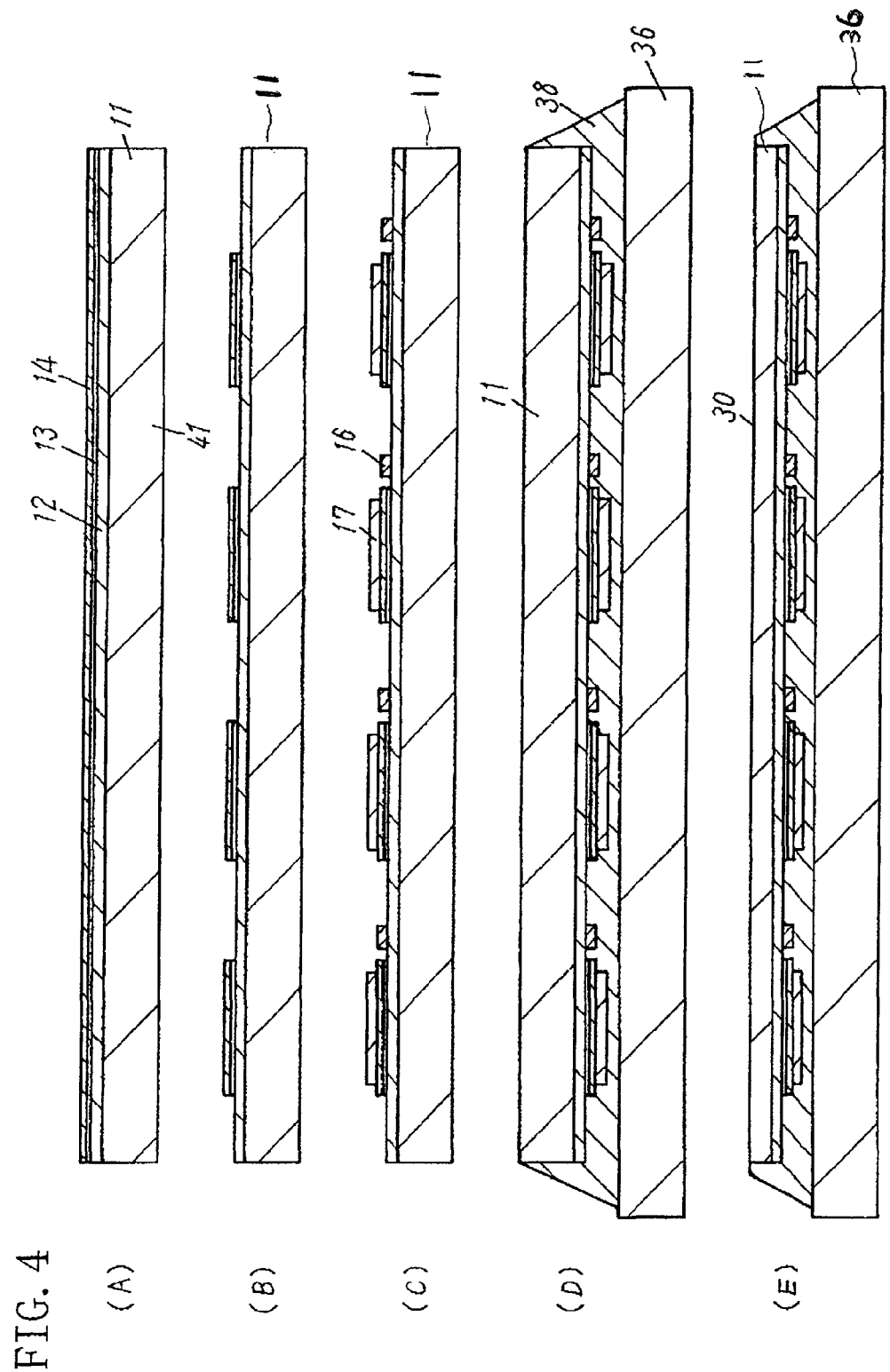
FIG. 4 illustrates a fabrication method of Embodiment 1.

FIG. 4 illustrates a fabrication method of a semiconductor light emitting element and a semiconductor light emitting device according to the present invention. First, an n-type semiconductor 12, an active layer 13, and a p-type semiconductor 14 are formed on a material that is to be a substrate 11 (FIG. 4(A)). The material that is to be the substrate is referred to as a wafer 41. Next, the p-type semiconductor 14 and the active layer 13 are partially removed by etching, thereby exposing the n-type semiconductor 12 (FIG. 4(B)).

An n-side electrode 16 and a p-side electrode 17 are formed on the exposed surface of the n-type semiconductor and the p-type semiconductor, respectively (FIG. 4(C)). After that, the substrate 11 is fixed onto a grinding board 36 with a filing material 38 (FIG. 4(D)). The grinding board 36 serves as a holding member when the substrate 11 is ground and polished. The material for the grinding board 36 is not specifically limited, but hard, undeformable materials such as ceramic are suitable. A thickness of approximately 20 mm to 30 mm is enough. Materials which are capable of firm fixation and which can be easily removed are good for the filling material 38. For example, wax materials such as electron wax are suitable.

The substrate is held to the grinding board 36 and ground (FIG. 4(E)). The ground surface is a radiant surface 30. The substrate is worked to have a desired thickness at this time. Since the substrate 11 is fixed to the grinding board 36 with the filling material 38, damage such as cracks due to stress during the work process does not occur in the substrate 11.

Figure 5:
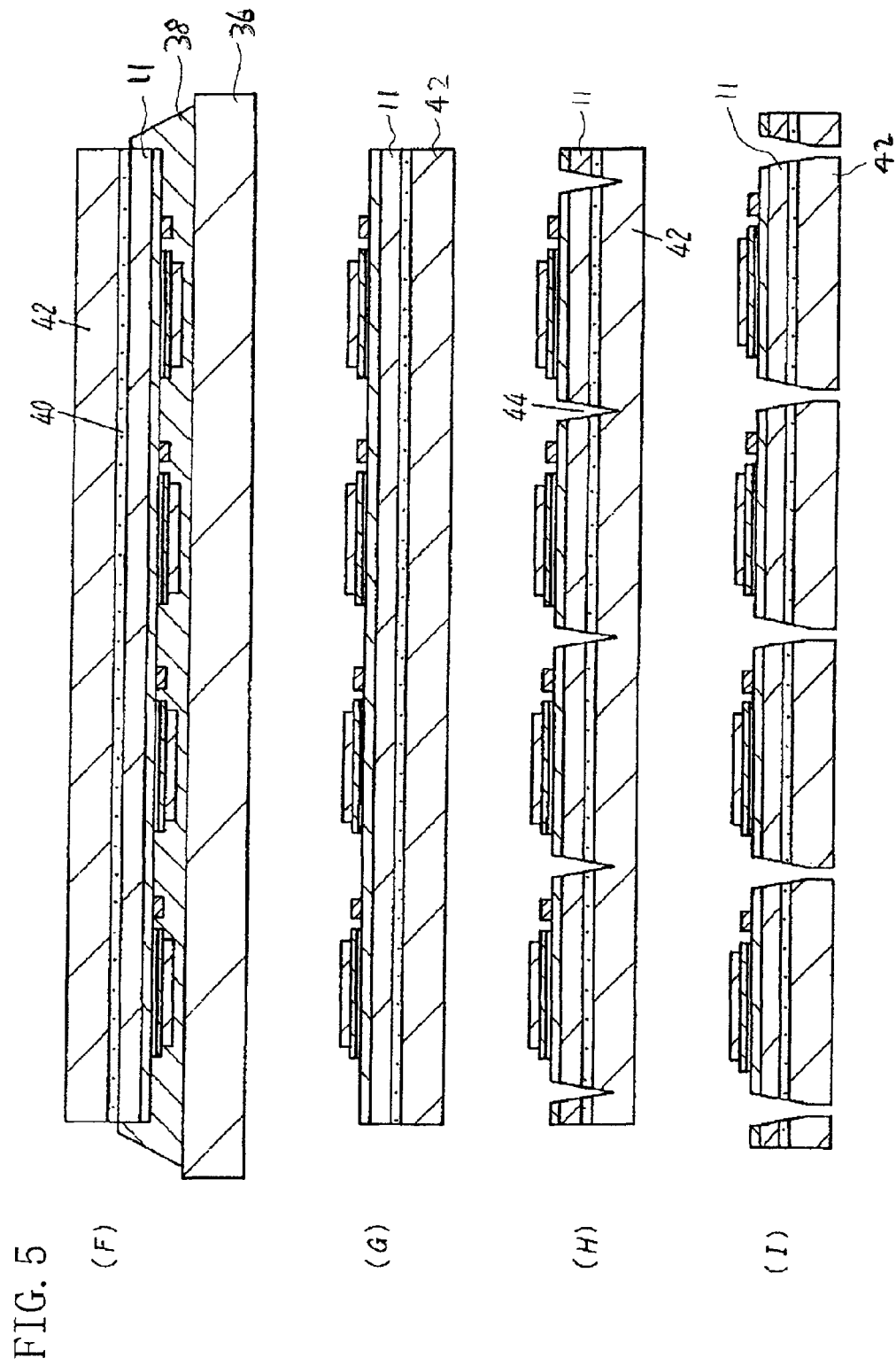
FIG. 5 illustrates a fabrication method of Embodiment 1.

FIG. 5 illustrates a fabrication method of the present invention that is continued from FIG. 4. A support substrate 42 is bonded to the substrate 11 whose thickness has been reduced by grinding and which is still held to the grinding board, using an adhesive 40 between the support substrate 42 and the substrate 11 (FIG. 5(F)). The support substrate 42 compensates for the mechanical strength of the substrate 11 whose thickness is reduced by grinding. Moreover, no cracks are made in the substrate 11 during the bonding step by bonding the support substrate 42 to the substrate with the grinding board holding the substrate.

This support substrate 42 will be eventually removed; therefore removable materials are used as the adhesive. It is preferable that the support substrate and the adhesive are translucent because light is actually emitted for inspection in the step shown in FIG. 5(I). Specifically, materials such as an acrylic adhesive and a UV curable resin are suitable. An epoxy adhesive can also be used. It is better that these adhesives are spin-coated since the adhesives need to be applied very thin. The adhesives may also be applied by other methods.

A transparent ceramic material such as cover glass can be used as a material for the support substrate. The thickness of the support substrate is not specifically limited, but approximately 0.15 mm to 0.2 mm is suitable.

After the bonding of the support substrate 42, the filling material 38 is removed and the grinding board 36 is detached (FIG. 5(G)). The grinding board 36 can be detached because the filling material 38 is easily melted by heat.

After that, notches 44 are made by laser scribing and other methods (FIG. 5(H)), thereby separating the semiconductor light emitting elements from one another (FIG. 5(I)). It is very unlikely that cracks are made in the substrate 11 during the separation step as well, by making the notches 44 until they cut into the support substrate 42.

After separated from one another, the semiconductor light emitting elements are inspected and filtered. Specifically, a current is applied to the electrodes to make the semiconductor light emitting elements actually emit light.

Figure 6:
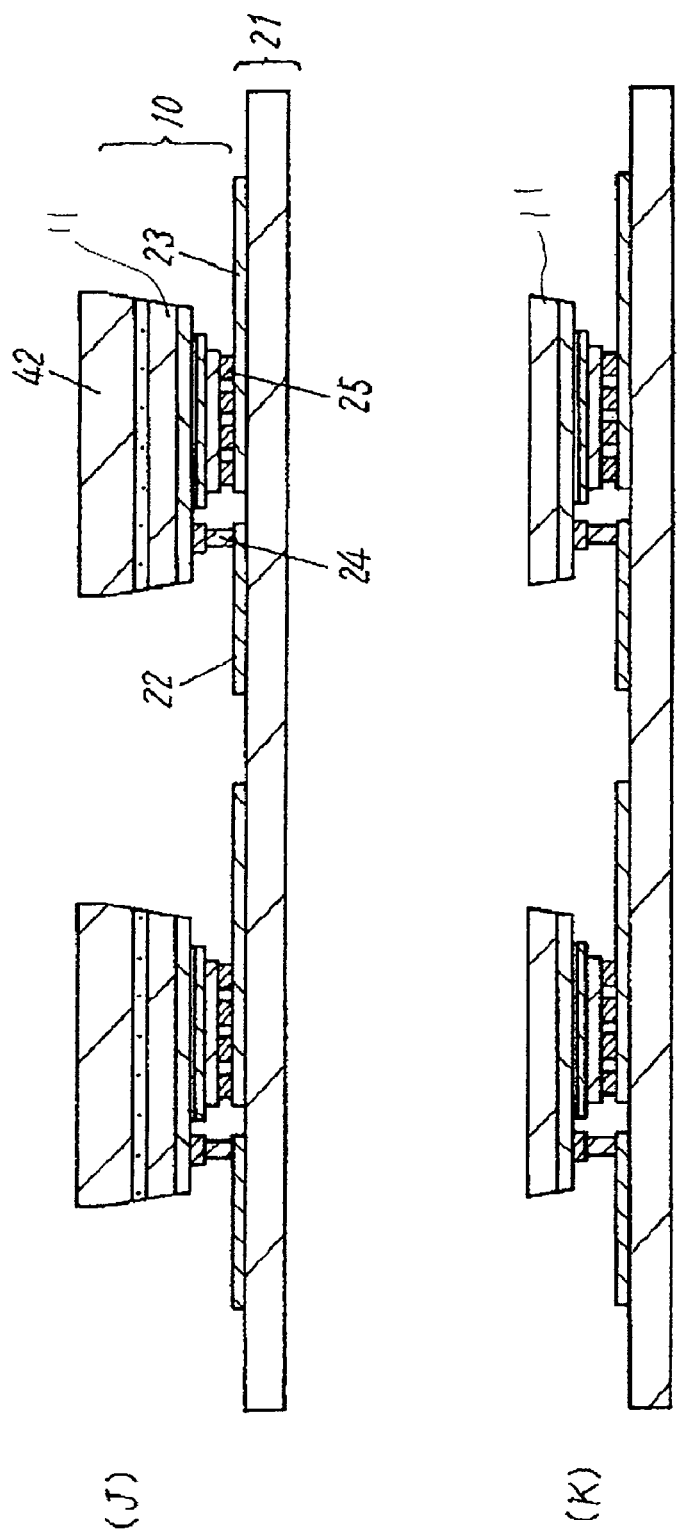
FIG. 6 illustrates a fabrication method of Embodiment 1.

FIG. 6 illustrates a method for fabricating a semiconductor light emitting device using the semiconductor light emitting element 10 obtained by the method shown in FIG. 5. Lead-out electrodes 22 and 23 are formed on a material that is to be a submount 21. Through holes and rear electrodes are also formed as needed. The lead-out electrodes 22 and 23 are provided with bumps 24 and 25. The semiconductor light emitting element 10 is then welded (FIG. 6(J)).

Next, the support substrate 42 is removed from the semiconductor light emitting device (FIG. 6(K)). Different methods can be used according to the kind of an adhesive used: the semiconductor light emitting device may be soaked in non-polar solvents such as acetone and methyl ethyl ketone (MEK), and tetrahydrofuran (THF) and dimethylformamide (DMF), or in the case where the adhesive is a thermoplastic material, heat may be applied to ease the adhesive and then detach the support substrate.

This enables semiconductor light emitting devices with a thin substrate 11 to be obtained in high yield.

Figure 7:
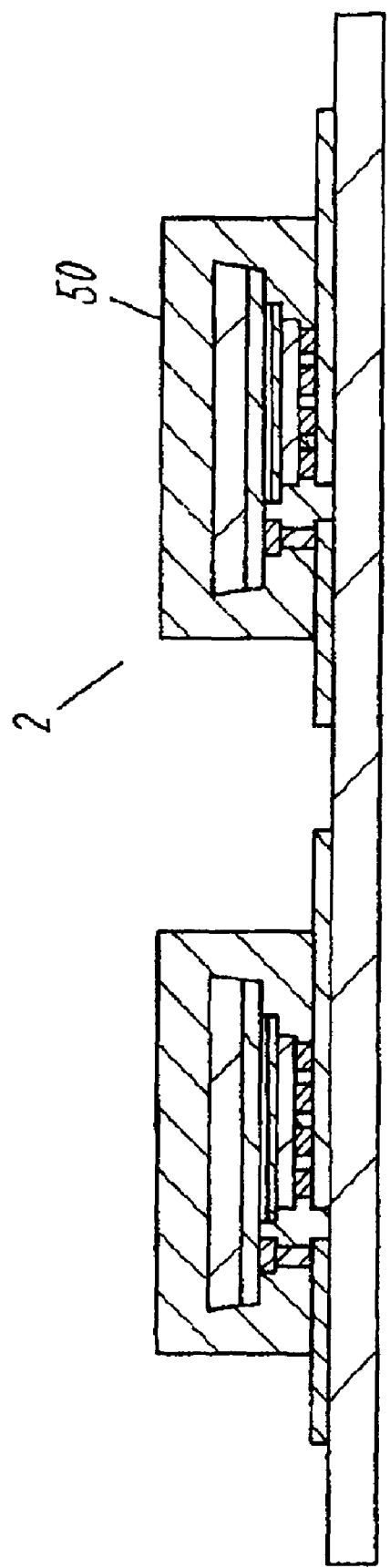
FIG. 7 illustrates a semiconductor light emitting device obtained by the fabrication method of Embodiment 1.

FIG. 7 illustrates a semiconductor light emitting device 2 in which a phosphor-containing sealing layer 50 is placed over the semiconductor light emitting device 1 fabricated by the method shown in FIG. 6. Fabrication methods are not specifically limited, but applying a coating for the phosphor-containing sealing layer 50 by printing takes a short time and is easy.

The phosphor-containing sealing layer 50 is made of a transparent medium, such as resin and glass, in which particles of an inorganic or organic phosphor material are dispersed.

For example, in the case where the semiconductor light emitting element 10 emits blue light and that makes the luminescent color of the semiconductor light emitting device 2 white, the phosphor is one that converts the wavelength of the blue light emitted from the semiconductor light emitting element 10 into the wavelength of yellow light and emits the yellow light. As a material for this kind of phosphor material, a rare-earth doped nitride based phospor or a rare-earth doped oxide based phosphor is preferable. More specifically, $(Y.Sm)_3(Al.Ga)_5O_{12}$:Ce and $(Y_{0.39}Gd_{0.57}Ce_{0.03}Sm_{0.01})_3Al_5O_{12}$ of a rare-earth doped alkali-earth metal sulfide rare-earth doped garnet, a rare-earth doped alkali-earth metal orthosilicate, a rare-earth doped thiogallate, a rare-earth doped aluminate and others are suitable. A silicate phosphor $(Sr_{1-a1-b2-x}Ba_{a1}Ca_{b2}Eu_x)_2SiO_4$ and an alpha sialon (α-sialon:Eu)$M_x(Si, Al)_{12}(O, N)_{16}$ can be used as a yellow light emitting phosphor material.

Resins including silicon resin, epoxy resin and fluororesin as a main component can be used as a medium. Among non-silicon resins, siloxane based resins, polyolefin, and silicone-epoxy hybrid resins are in particular suitable.

A glass material generated by a sol-gel method may also be used in place of resins. Specifically, the glass material is a compound having the general formula $Si(X)_n(R)_{4-n}$ (n=1 through 3). Here, R represents alkyl group and X is selected from halogen (Cl, F, Br, I), hydroxy group (—OH) and alkoxy group (—OR). It is possible to add in this glass material as well, a phosphor and alkoxide having the general formula $M(OR)_n$. The refractive index of asperities can be varied by adding alkoxide.

These glass materials include one whose curing reaction temperature is approximately 200 degrees centigrade and are thus suitable if heat-resisting properties of the materials for bumps and electrodes are taken into account. A mixture of a phosphor and a medium is referred to as a phosphor coating.

Embodiment 2

A fabrication method of the present invention may also include a step of giving a reflection prevention treatment to a radiant surface of the substrate 11.

In a semiconductor light emitting device, a reflection prevention treatment given to a radiant surface prevents total reflection of light which passes through the substrate and which comes into the radiant surface at a shallow angle, and improves the light extraction efficiency from a semiconductor light emitting element.

Figure 8:
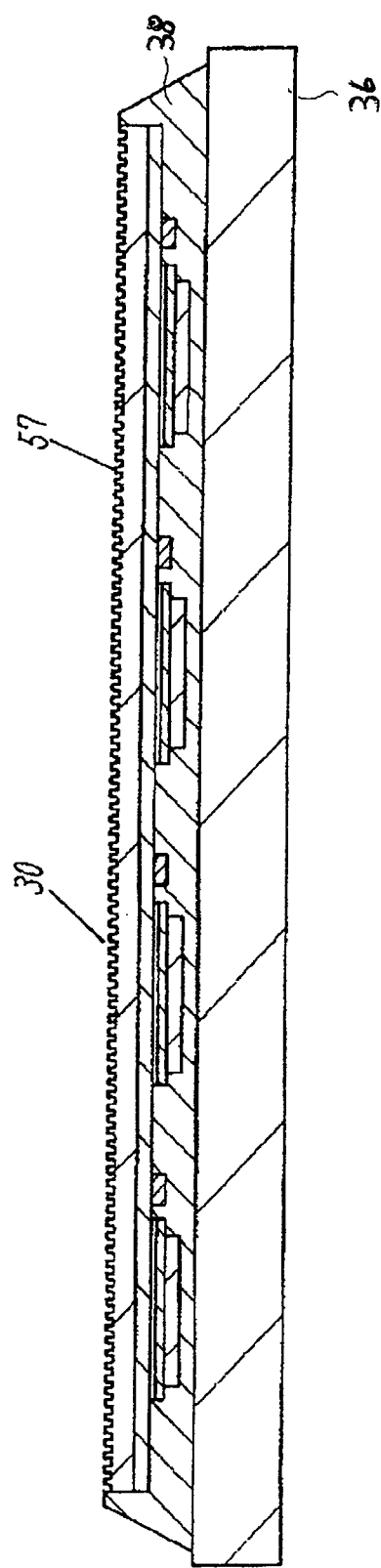
FIG. 8 illustrates a key step in a fabrication method of Embodiment 2.

FIG. 8 illustrates a fabrication method of a semiconductor light emitting device 3 to which a reflection prevent treatment is given. The fabrication method of the semiconductor light emitting device 3 is the same as that in Embodiment 1, except that the step shown in FIG. 8 is added after FIG. 4(E) described in Embodiment 1. FIG. 8 illustrates a step in which a reflection prevention treatment 57 is given to a radiant surface 30.

In the reflection prevention treatment 57, small asperities are formed in the radiant surface 30. The small asperities avoid the total reflection at the radiant surface and improve the light extraction efficiency.

The small asperities may have fine patterns which are approximately equal to a wavelength of light by applying a microfabrication method using a nanoimprint technique, or finer patterns depending on the light to be used. Various shapes, such as groove-like shapes, conical shapes, and hemispherical shapes, are possible for the small asperities. In the case where the nanoimprint technique is used, a polymer resist such as PMMA (polymethyl methacrylate) is applied to the radiant surface, dried and baked, and then shapes of asperities formed in the mold surface are transferred.

Formation of the surface asperities by etching has simple steps and improves the light extraction efficiency. However, formation by etching has aspects that precise control of the asperity shapes is difficult and that exactly the same asperity shapes cannot be formed in many substrate surfaces. Etching may include wet etching and dry etching. Dry etching includes ion milling, chlorine gas method and others. In wet etching, etchant which predominantly includes alkali can be used.

Further, the grain size of a grinding wheel which is used at the end of a grinding step may be adjusted so that the substrate surface may be finished to have a certain range of roughness after grinding, and the surface roughness may function as the substrate surface asperities.

Furthermore, the substrate surface asperities can be formed by an inkjet printing method. This method does not include a substrate etching step and therefore can be carried out simply. The light extraction efficiency can be improved by adjusting the refractive index of the asperities to be formed.

Figure 9:
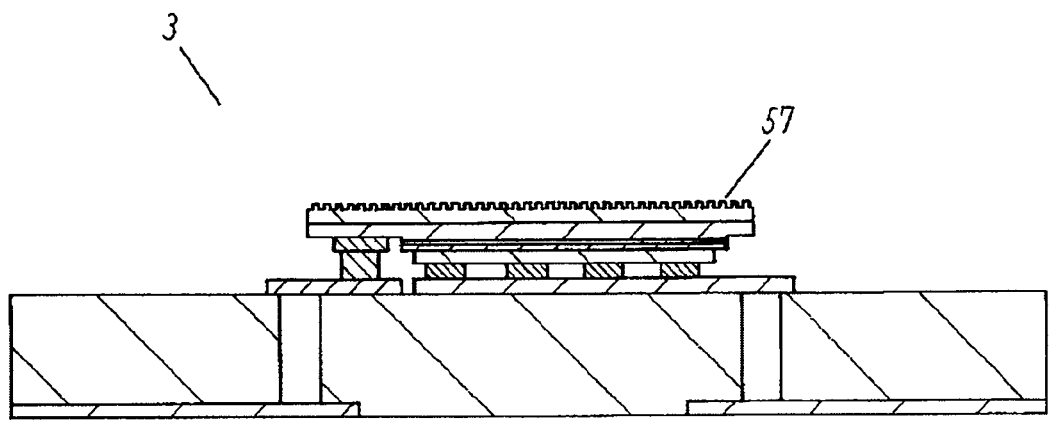
FIG. 9 illustrates a semiconductor light emitting device obtained by the fabrication method of Embodiment 2.

The semiconductor light emitting device 3 (FIG. 9) can be obtained by adding the step of the reflection prevention treatment 57 (FIG. 8) to the steps of Embodiment 1.

Figure 10:
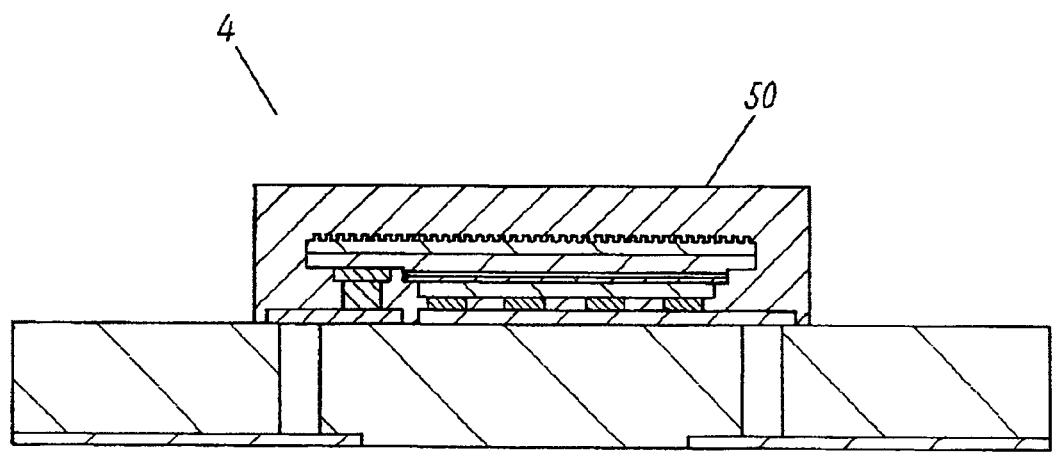
FIG. 10 illustrates a semiconductor light emitting device obtained by the fabrication method of Embodiment 2.

Moreover, it is possible to obtain a semiconductor light emitting device 4 (FIG. 10) in which a phosphor-containing sealing layer 50 is provided over a semiconductor light emitting element as in Embodiment 1.

Throughout the present specification, Al represents aluminum; N nitrogen; O oxygen; Ag silver; Rh rhodium; Pt platinum; Ni nickel; Co cobalt; Ti titanium; Au gold; Y yttrium; Sm samarium; Ce cerium; Sr strontium; Ba barium; Ca calcium; Eu europium; and Mg magnesium.

INDUSTRIAL APPLICABILITY

The present invention can be used in fabricating a semiconductor light emitting device with a thin substrate in good yield.

The invention claimed is:

1. A method for fabricating a semiconductor light emitting element, comprising the steps of:
   forming on a substrate a light emitting layer including an n-type layer, an active layer and a p-type layer;
   partially removing the active layer and the p-type layer and forming an n-side electrode and a p-side electrode on the n-type layer and the p-type layer, respectively;
   bonding a side of the substrate on which the light emitting layer is formed to a grinding board via a filling material;
   grinding the substrate;
   bonding a support substrate to the ground substrate surface;
   detaching the grinding board from the substrate to which the support substrate is bonded;
   forming a notch in the n-type layer;
   performing a singulation operation; and
   detaching the support substrate.

2. A method for fabricating a semiconductor light emitting device, comprising the steps of:
   forming on a substrate a light emitting layer including an n-type layer, an active layer and a p-type layer;
   partially removing the active layer and the p-type layer and forming an n-side electrode and a p-side electrode on the n-type layer and the p-type layer, respectively;
   bonding a side of the substrate on which the light emitting layer is formed to a grinding board via a filling material;
   grinding the substrate;
   bonding a support substrate to the ground substrate surface;
   detaching the grinding board from the substrate to which the support substrate is bonded;
   forming a notch in the n-type layer;
   performing a singulation operation;
   connecting the n-side electrode and the p-side electrode to a submount provided with a lead-out electrode; and
   detaching the support substrate.

3. The method of claim 2 comprising, after the step of detaching the support substrate, a step of forming a phosphor-containing sealing layer.

4. A method for fabricating a semiconductor light emitting element, comprising the steps of:
   forming on a substrate a light emitting layer including an n-type layer, an active layer and a p-type layer;
   partially removing the active layer and the p-type layer and forming an n-side electrode and a p-side electrode on the n-type layer and the p-type layer, respectively;
   bonding a side of the substrate on which the light emitting layer is formed to a grinding board via a filling material;
   grinding the substrate;
   giving a total reflection prevention treatment to the ground substrate surface;
   bonding a support substrate to the substrate surface to which the total reflection prevention treatment is given;
   detaching the grinding board from the substrate to which the support substrate is bonded;
   forming a notch in the n-type layer;
   performing a singulation operation; and
   detaching the support substrate.

5. A method of fabricating a semiconductor light emitting device, comprising the steps of:
   forming on a substrate a light emitting layer including an n-type layer, an active layer and a p-type layer;
   partially removing the active layer and the p-type layer and forming an n-side electrode and a p-side electrode on the n-type layer and the p-type layer, respectively;

bonding a side of the substrate on which the light emitting layer is formed to a grinding board via a filling material;
grinding the substrate;
giving a total reflection prevention treatment to the ground substrate surface;
bonding a support substrate to the substrate surface to which the total reflection prevention treatment is given;
detaching the grinding board from the substrate to which the support substrate is bonded;
forming a notch in the n-type layer;
performing a singulation operation;
connecting the n-side electrode and the p-side electrode to a submount provided with a lead-out electrode; and
detaching the support substrate.

6. The method of claim 5 comprising, after the step of detaching the support substrate, a step of forming a phosphor-containing sealing layer.

* * * * *